(12) United States Patent
Chuang et al.

(10) Patent No.: US 11,990,531 B2
(45) Date of Patent: May 21, 2024

(54) VERTICAL TUNNELING FIELD-EFFECT TRANSISTOR CELL

(71) Applicant: Taiwan Semiconductor Manufacturing Company, Ltd., Hsinchu (TW)

(72) Inventors: Harry-Hay-Lay Chuang, Singapore (SG); Cheng-Cheng Kuo, Hsinchu (TW); Ming Zhu, Singapore (SG)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 301 days.

(21) Appl. No.: 17/322,512

(22) Filed: May 17, 2021

(65) Prior Publication Data

US 2021/0296471 A1 Sep. 23, 2021

Related U.S. Application Data

(60) Continuation of application No. 16/579,110, filed on Sep. 23, 2019, now Pat. No. 11,011,621, which is a continuation of application No. 15/797,674, filed on Oct. 30, 2017, now Pat. No. 10,424,652, which is a continuation of application No. 14/874,398, filed on Oct. 3, 2015, now Pat. No. 9,806,172, which is a division of application No. 13/749,186, filed on Jan. 24, 2013, now Pat. No. 9,159,826.

(51) Int. Cl.
| | |
|---|---|
| *H01L 29/66* | (2006.01) |
| *H01L 29/06* | (2006.01) |
| *H01L 29/739* | (2006.01) |
| *H01L 29/78* | (2006.01) |

(52) U.S. Cl.
CPC .... *H01L 29/66666* (2013.01); *H01L 29/0657* (2013.01); *H01L 29/66356* (2013.01); *H01L 29/7391* (2013.01); *H01L 29/7827* (2013.01)

(58) Field of Classification Search
CPC ........... H01L 29/66666; H01L 29/0657; H01L 29/66356; H01L 29/7391; H01L 29/7827
USPC .................................. 257/329, 38; 438/268
See application file for complete search history.

(56) References Cited

U.S. PATENT DOCUMENTS

| | | |
|---|---|---|
| 6,133,105 A | 10/2000 | Chen et al. |
| 6,319,785 B1 | 11/2001 | Ha et al. |
| 6,710,413 B2 | 3/2004 | Thei et al. |
| 7,524,751 B2 | 4/2009 | Ryu |
| 8,754,470 B1 | 6/2014 | Chuang et al. |

(Continued)

OTHER PUBLICATIONS

Zhao H, et al., In0.7Ga9.3As tunneling field-effect transistors with an Ion of 50 uA/um and a subthreshold swing of 86 mV/dec using Hf02 gate oxide, IEEE Electron Device Lett, 21, 1392 (2010).

(Continued)

*Primary Examiner* — Mohammad M Hoque
(74) *Attorney, Agent, or Firm* — Haynes and Boone, LLP

(57) ABSTRACT

A tunneling field-effect transistor (TFET) device is disclosed. A protrusion structure is disposed over the substrate and protrudes out of the plane of substrate. Isolation features are formed on the substrate. A drain region is disposed over the substrate adjacent to the protrusion structure and extends to a bottom portion of the protrusion structure as a raised drain region. A drain contact is disposed over the drain region and overlap with the isolation feature.

20 Claims, 11 Drawing Sheets

(56) References Cited

U.S. PATENT DOCUMENTS

| | | | |
|---|---|---|---|
| 9,159,826 | B2 | 10/2015 | Chuang et al. |
| 9,190,484 | B2 | 11/2015 | Chuang et al. |
| 9,536,977 | B2 | 1/2017 | Chuang et al. |
| 9,806,172 | B2 | 10/2017 | Chuang et al. |
| 10,424,652 | B2 | 9/2019 | Chuang et al. |
| 2001/0042892 | A1 | 11/2001 | Okada et al. |
| 2004/0126944 | A1 | 7/2004 | Pacheco Rotondaro et al. |
| 2005/0051852 | A1 | 3/2005 | Kim et al. |
| 2008/0182407 | A1 | 7/2008 | Zhai et al. |
| 2010/0200916 | A1 | 8/2010 | Gossner et al. |
| 2011/0115011 | A1* | 5/2011 | Masuoka ............ H01L 29/0657 257/E27.06 |
| 2011/0253981 | A1* | 10/2011 | Rooyackers ...... H01L 29/66356 977/840 |
| 2011/0315960 | A1 | 12/2011 | Goel et al. |
| 2012/0113726 | A1 | 5/2012 | Huang et al. |
| 2012/0187376 | A1 | 7/2012 | Tomioka et al. |
| 2014/0291616 | A1* | 10/2014 | Park ................... H01L 29/7391 438/285 |
| 2016/0027898 | A1 | 1/2016 | Chuang et al. |
| 2018/0069096 | A1 | 3/2018 | Chuang et al. |
| 2020/0020788 | A1 | 1/2020 | Chuang et al. |

OTHER PUBLICATIONS

Mohata D, et al., Experimental staggered-source and N+ pocket-doped channel III-V tunnel field-effect transistors and their scalabilities, App Phys Express, 4 (2011).

Sterkel M, et al., Characteristics and optimization of vertical and planar tunneling-FETs, J of Phys: Conference Series, 10 (2005).

Schmid H, et al., Fabrication of vertical InAs—Si heterojunction tunnel field effect transistors, IEEE Device Research Conference (2011).

* cited by examiner

VERTICAL TUNNELING FIELD-EFFECT TRANSISTOR CELL

CROSS-REFERENCE

The present application is a continuation of U.S. application Ser. No. 16/579,110, filed Sep. 23, 2019, which is continuation of U.S. application Ser. No. 15/797,674, filed Oct. 30, 2018, which is continuation of U.S. application Ser. No. 14/874,398, filed Oct. 3, 2015, which is a divisional of U.S. application Ser. No. 13/749,186, filed Jan. 24, 2013, each of which is hereby incorporated by reference in its entirety. This patent is related to the following patents, the disclosures of which are hereby incorporated by reference:

A Vertical Tunneling Field-Effect Transistor Cell And Fabricating The Same, Ser. No. 13/745,225 filed Jan. 18, 2013;

A Vertical Tunneling Field-Effect Transistor Cell And Fabricating The Same, Ser. No. 13/745,459 filed Jan. 18, 2013;

A Vertical Tunneling Field-Effect Transistor Cell And Fabricating The Same, Ser. No. 13/745,579 filed Jan. 18, 2013.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

However, as the size of the smallest component has decreased, numerous challenges have risen. As features become closer, current leakage can become more noticeable, signals can crossover more easily, and power usage has become a significant concern. The semiconductor integrated circuit industry has produced numerous developments in effort to continue the process of scaling. One of the developments is the potential replacement or supplementation of the conventional MOS field-effect transistor by the tunneling field-effect transistor (TFET).

TFETs are promising devices that may enable further scaling of power supply voltage without substantially increasing off-state leakage currents due to its sub-60 mV/dec subthreshold swing. However, existing TFETs have not been satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
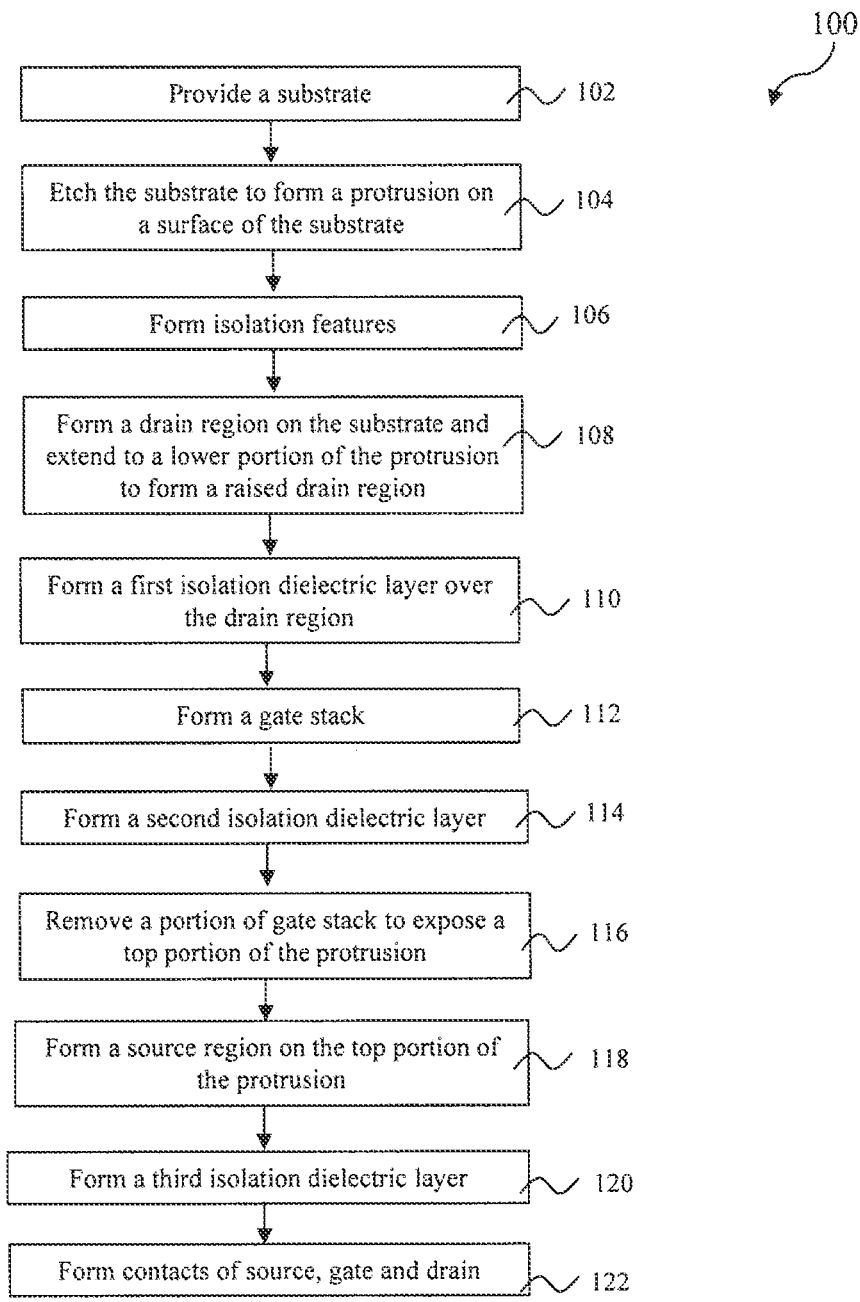
FIG. 1 is a flowchart of an example method for fabricating a semiconductor device constructed according to various aspects of the present disclosure.

FIG. 1 is a flowchart of one embodiment of a method 100 of fabricating one or more TFET devices according to aspects of the present disclosure. The method 100 is discussed in detail below, with reference to a TFET device 200 shown in FIGS. 2-11 for the sake of example.

Figure 2:
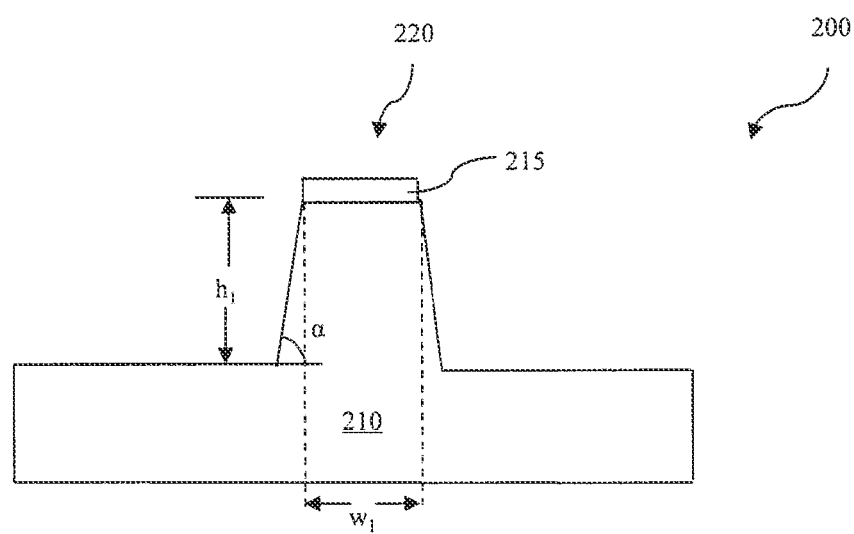
FIGS. 2-11 are cross-sectional views of an example semiconductor device at fabrication stages constructed according to the method of FIG. 1.

Referring to FIGS. 1 and 2, the method 100 begins at step 102 by providing a substrate 210. The substrate 210 includes silicon. In alternative embodiments, the substrate 210 may include germanium, silicon germanium, gallium arsenide, silicon carbide, indium arsenide, indium phosphide, gallium arsenic phosphide, gallium indium, or other appropriate semiconductor materials. Alternatively and for some embodiments, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials. The substrate 210 may also include various p-type doped regions and/or n-type doped regions, implemented by a process such as ion implantation and/or diffusion. Those doped regions include n-well and p-well.

The method 100 proceeds to step 104 by etching the substrate 210 to form a frustoconical protrusion structure 220 with a first height $h_1$, which protrudes out of the plane of substrate 210. The frustoconical protrusion structure 220 is referred as a core structure 220. The core structure 220 may be formed by lithography and etching processes. In one embodiment, a hard mask layer 215 is deposited on the substrate 210 first. The hard mask 215 includes silicon oxide, silicon nitride, silicon oxynitride, or any other suitable dielectric material. The hard mask 215 may be patterned by lithography and etching processes to define the core structure 220 with a first width $w_1$. The substrate 210 is etched by using the patterned hard mask 215 as an etching mask to form the core structure 220. The etch process may include wet etch, dry etch, or a combination thereof. The core structure 220 can be formed with sidewalls having an angle α with the planar surface of the substrate 210 ranging from approximately 45 degrees to around 90 degrees.

In one embodiment, the core structure 220 is formed as a cylinder shape. Alternatively, the core structure 220 is formed as square-column, oval cylinder, rectangular column, hexagonal column, or other polygon-column shape.

Figure 3:
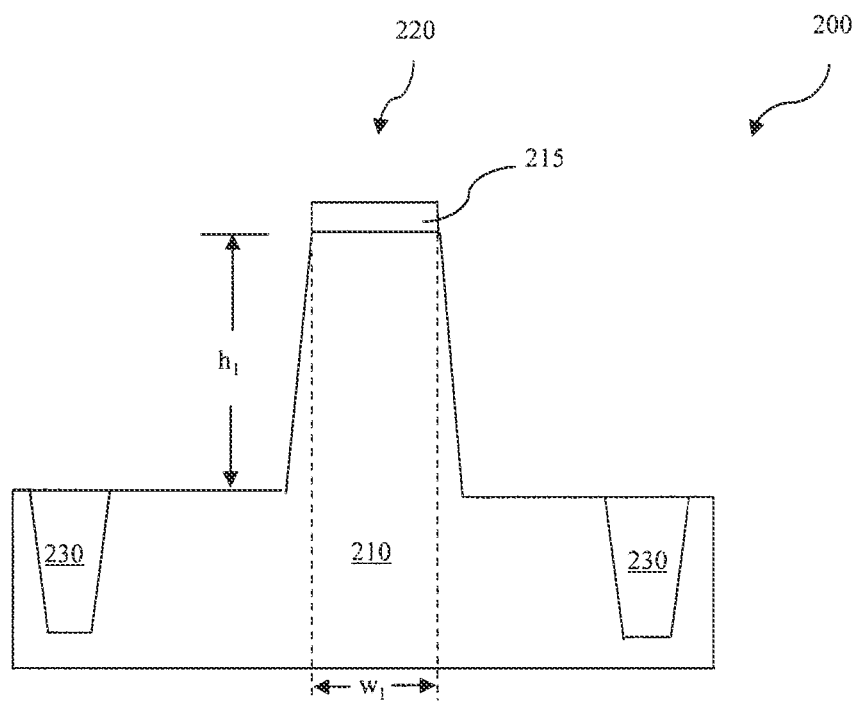

Referring to FIGS. 1 and 3, the method 100 proceeds to step 106 by forming isolation features 230 on the substrate 210, including between each core structure 220. The isolation features 230 may include similar or different structures formed by using different processing technologies. In one embodiment, the isolation features 230 are shallow trench isolation (STI) features. The formation of a STI may include etching a trench in the substrate 210 and filling in the trench with insulator materials such as silicon oxide, silicon nitride, or silicon oxynitride. The filled trench may have a multilayer structure such as a thermal oxide liner layer with silicon nitride filling the trench.

Figure 4:
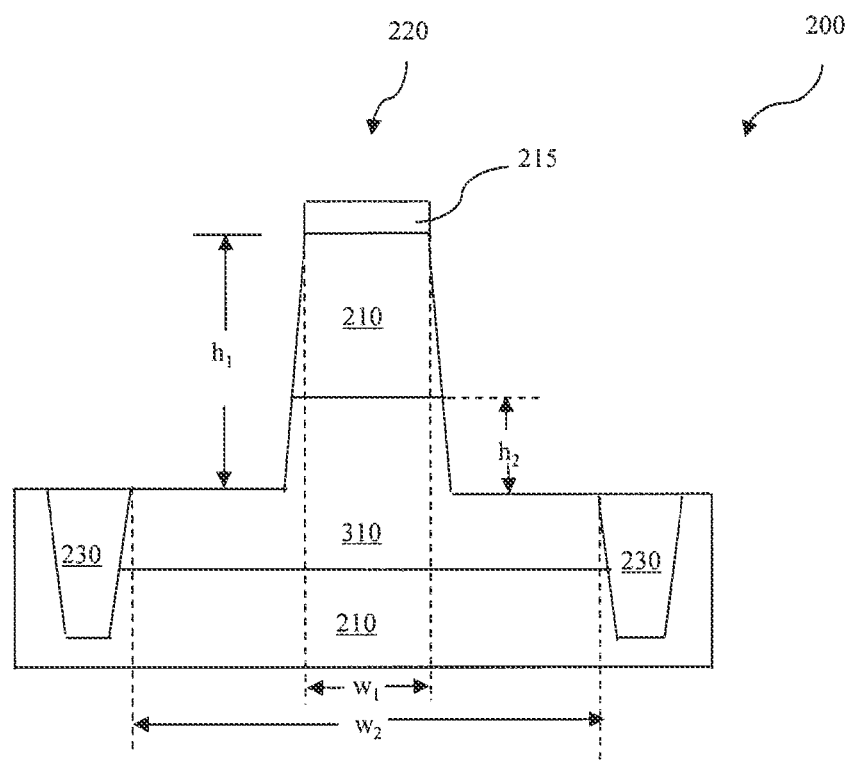

Referring to FIGS. 1 and 4, the method 100 proceeds to step 108 by forming a drain region 310 with a second width $w_2$ on the substrate 210. The second width $w_2$ is substantially larger than the first width $w_1$. In one embodiment, the drain region 310 is concentric with the core structure 220 and isolated to each other by the isolation feature 230. The drain region 310 is formed by doping a predetermined top portion of the substrate 210 by a suitable technique, such as implantation with a patterned photo resist as an implantation mask. In the present embodiment, the drain region 310 is adjacent to the core structure 220 and between the isolation features 230. For a p-type TFET, the drain region 310 may be doped with p-type dopants, such as boron or $BF_2$. For an n-type TFET, the drain region 310 may be doped with n-type dopants, such as phosphorus, arsenic, or combinations thereof. After the implantation, one or more annealing processes may be performed for dopant activation. The annealing processes may include rapid thermal anneal (RTA), laser anneal, or other suitable annealing process. As an example, high-temperature anneal includes a "spike" annealing process that has a very short time duration. During the formation, the dopant is diffused up to a bottom portion of the core structure 220 with a second height of $h_2$, referred as to a raised drain region 310.

Figure 5:
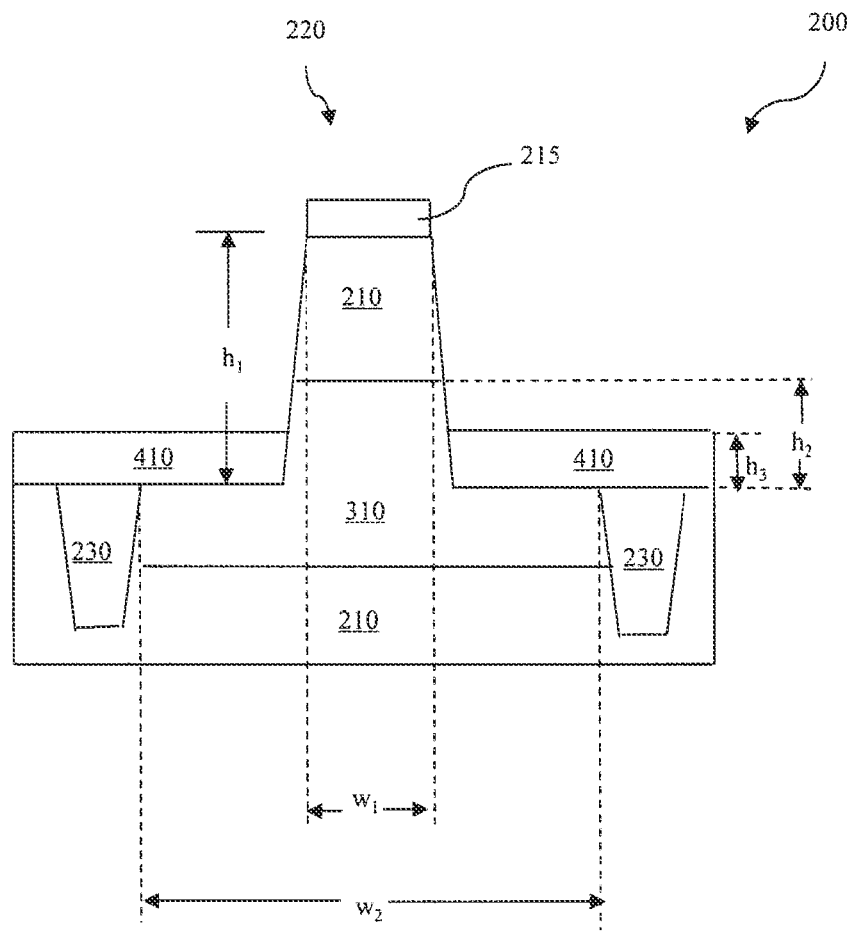

Referring to FIGS. 1 and 5, the method 100 proceeds to step 110 by forming a first isolation dielectric layer 410 over the drain region 310 by deposition and recess processes. The first isolation dielectric layer 410 includes silicon oxide, silicon nitride, silicon carbide, oxynitride or other suitable materials. The first isolation dielectric layer 410 may include a single layer or multiple layers. The first isolation dielectric layer 410 is deposited by a suitable technique, such as chemical vapor deposition (CVD), atomic layer deposition (ALD), physical vapor deposition (PVD), thermal oxidation, or combinations thereof. In the present embodiment, the isolation dielectric layer 410 is etched back to a third height $h_3$, which is substantial less than the second height $h_2$ of the raised drain region 310. The first isolation dielectric layer 410 may be recessed by a selective dry etch, a selective wet etch, or a combination thereof.

Figure 6:
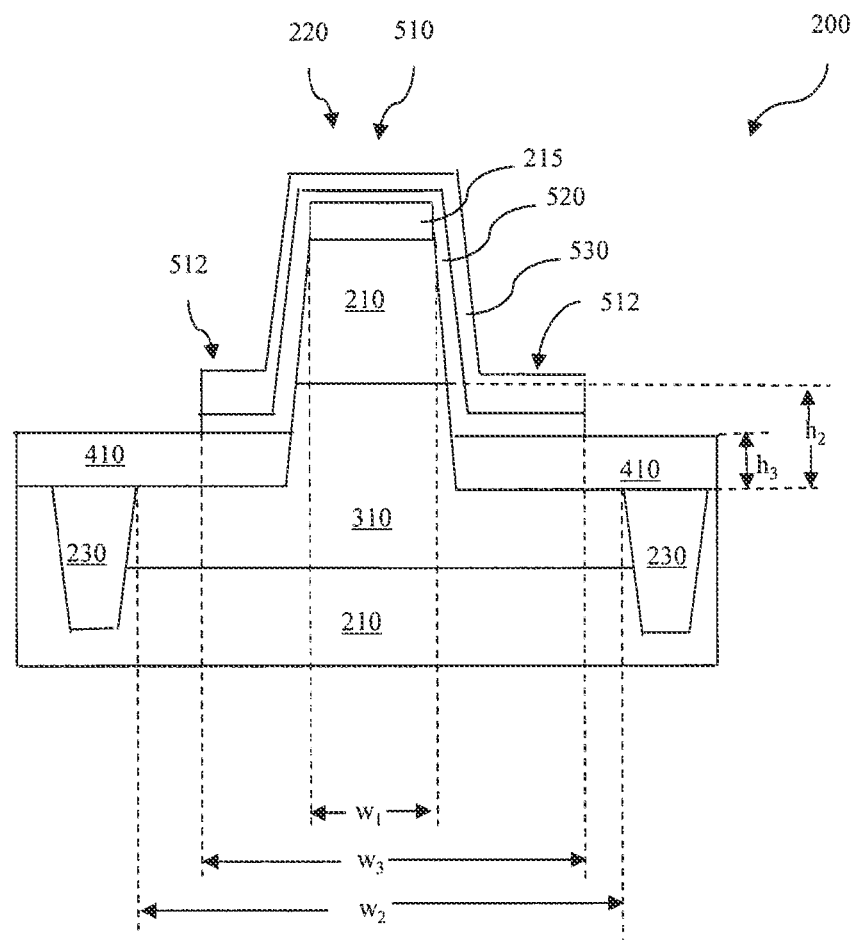

Referring to FIGS. 1 and 6, the method 100 proceeds to step 112 by forming a gate stack 510. The gate stack 510 includes a planar portion 512, which is parallel to the surface of substrate 210 and over the first isolation dielectric layer 410, and a gating surface, which wraps around a middle portion of the core structure 220. The planar portion may be asymmetric to the core structure 220. A total width of the gate stack 510, a third width $w_3$, is substantially larger than the first width $w_1$ of the core structure 220 and less than the second width $w_2$ of the drain region 310. In one embodiment, the out-of-plane gating surface of gate stack 510 overlaps a portion of the raised drain region 310.

The gate stack 510 is formed by any suitable process or processes. For example, the gate stack 510 is formed by a procedure including depositing, photolithography patterning, and etching processes. The deposition processes include CVD, PVD, ALD, metalorganic CVD (MOCVD), other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching process includes a dry etch, a wet etch, or a combination of dry etch and wet etch. The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof. The etching process may include a multiple-step etching to gain etch selectivity, flexibility and desired etch profile.

In one embodiment, the gate stack 510 is a high-k (HK)/metal gate (MG). The HK/MG includes a gate dielectric layer 520 and a MG 530. The gate dielectric layer 520 may include an interfacial layer (IL) and a high-k (HK) dielectric layer. The IL includes oxide, HfSiO and oxynitride. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The MG 530 may include a single layer or multi layers, such as a metal layer, a liner layer, a wetting layer, and an adhesion layer. The MG 530 may include Ti, Ag, Al, TiAlN, TaC, TaCN, TaSiN, Mn, Zr, TiN, TaN, Ru, Mo, Al, WN, Cu, W, or any suitable materials.

In another embodiment, the gate stack 510 is a polysilicon gate stack. The polysilicon gate stack may include a gate dielectric layer and a polysilicon layer deposited over the gate dielectric layer. The gate dielectric layer includes silicon oxide, silicon nitride, or any other suitable materials.

Figure 7:
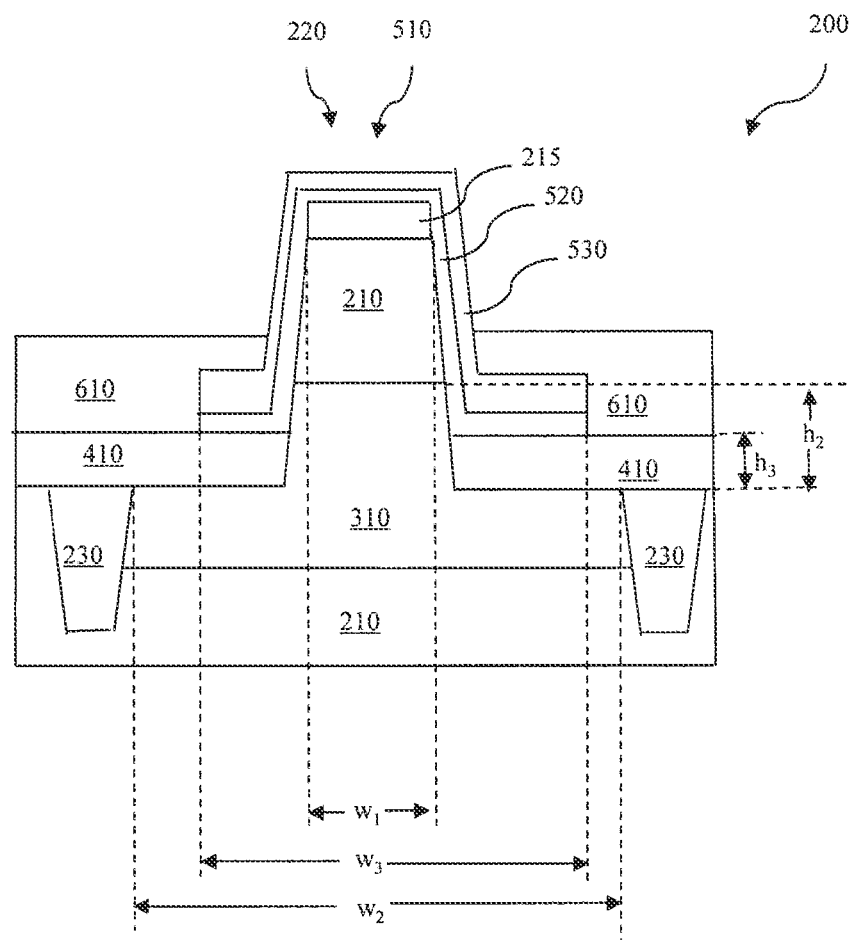

Referring to FIGS. 1 and 7, the method 100 proceeds to step 114 by forming a second isolation dielectric layer 610 over the first isolation dielectric layer 410, including over the planar portion of the gate stack. The second isolation dielectric layer 610 is similar in many respects to those discussed above in association with the first isolation dielectric layer 410 in FIG. 5. The second isolation dielectric layer 610 is etched back to expose a predetermined height of a top portion of the gating surface of gate stack 510. In one embodiment, the predetermined height is substantially larger than a thickness of the hard mask layer 215.

Figure 8:
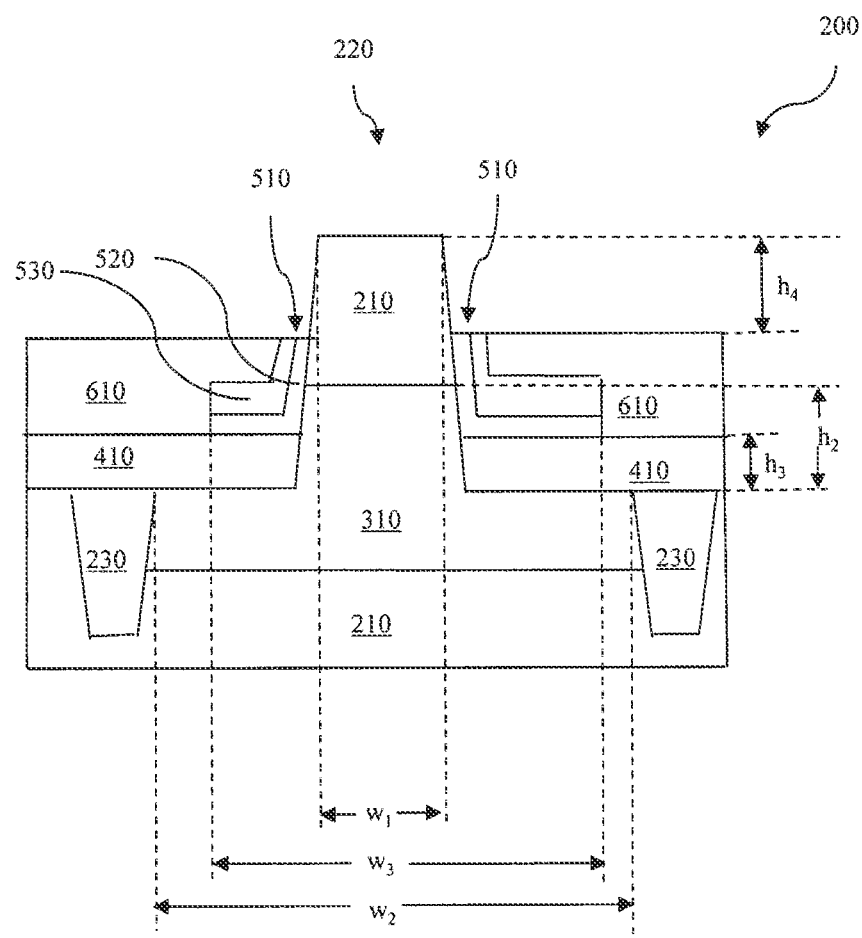

Referring to FIGS. 1 and 8, the method 100 proceeds to step 116 by removing a top portion of the gating surface of the gate stack 510 to expose a top portion of the core structure 220 with a fourth height $h_4$. The top portion of the gating surface of the gate stack 510 may be removed by a selective dry etch, a selective wet etch, a combination thereof, or other suitable processes. The hard mask layer 215 is also removed at the same etch process or at an extra etch process. In one embodiment, the gating surface of the gate stack 510 above the second isolation dielectric layer 610 is removed.

Figure 9:
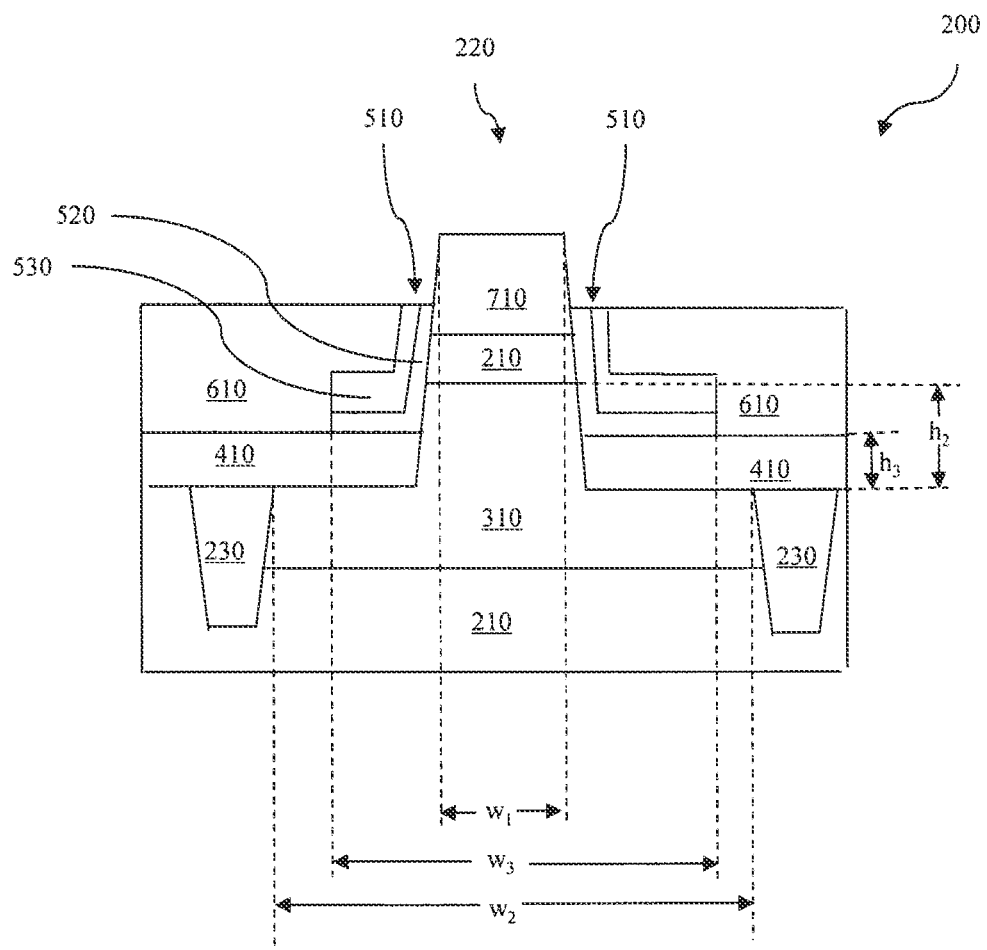

Referring to FIGS. 1 and 9, the method 100 proceeds to step 118 by forming a source region 710 in the top portion of the core structure 220. In one embodiment, the source region 710 is formed by photolithography patterning and implantation, which is similar in many respects to those discussed above in association with the drain region 310 in FIG. 4. The source region 710 has a different dope type than the drain region 310. In another embodiment, the core structure 220 is recessed first and then the source region 710 is formed as the top portion of the recessed core structure 220 by photolithography patterning and implantation. In yet another embodiment, a semiconductor material is epitaxially grown on the recessed core structure 220. The semiconductor material layer includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial processes include CVD deposition techniques (e.g., vapor-phase epitaxy (VPE) and/or ultra-high vacuum CVD (UHV-CVD)), molecular beam epitaxy, and/or other suitable processes. The S/D features may be formed by one or more epitaxy or epitaxial (epi) processes. The source region 710 may be in-situ doped during the epitaxy process. In one embodiment, the source region 710 is not in-situ doped, an implantation process (i.e., a junction implant process) is performed to dope the source region 710.

Figure 10:
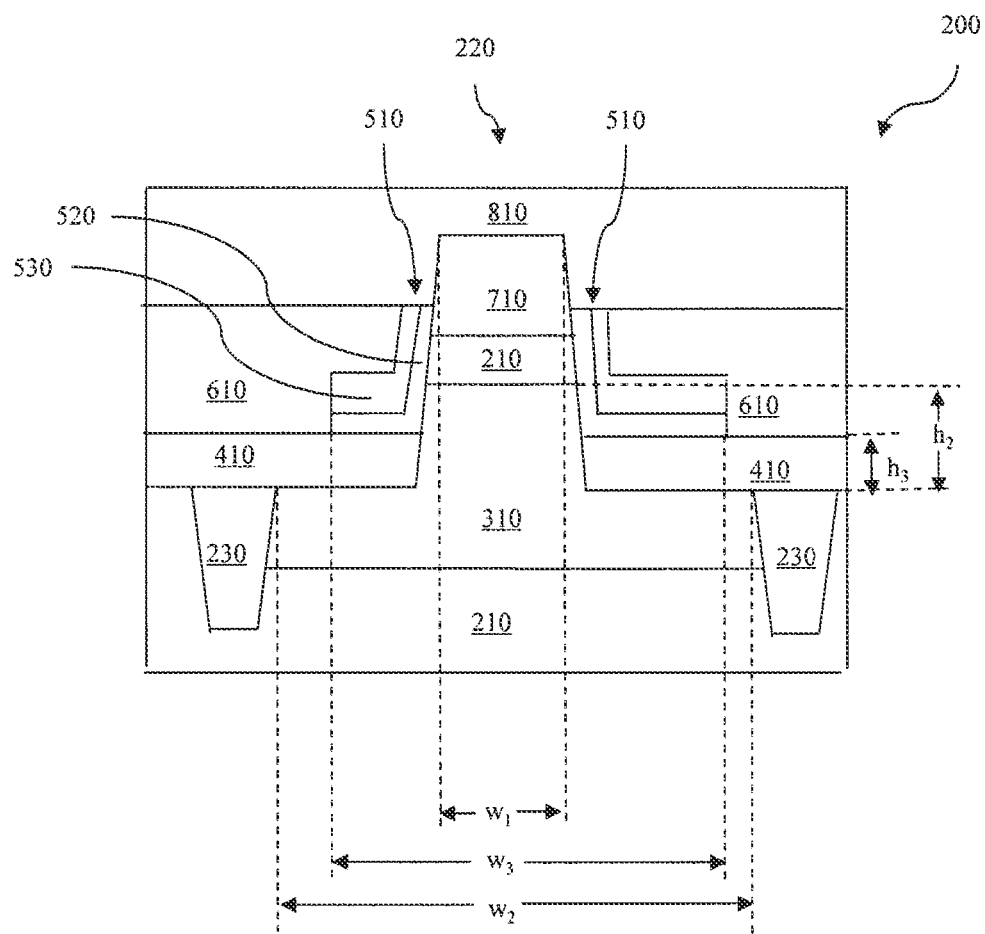

Referring to FIGS. 1 and 10, the method 100 proceeds to step 120 by depositing a third isolation dielectric layer 810 over the second isolation dielectric layer 610, including over the source region 710. The third isolation dielectric layer 810 is similar in many respects to those discussed above in association with the first isolation dielectric layer 410 in FIG. 3. Additionally, a CMP process is performed to planarize the top surface of the third isolation dielectric layer 810.

Figure 11:
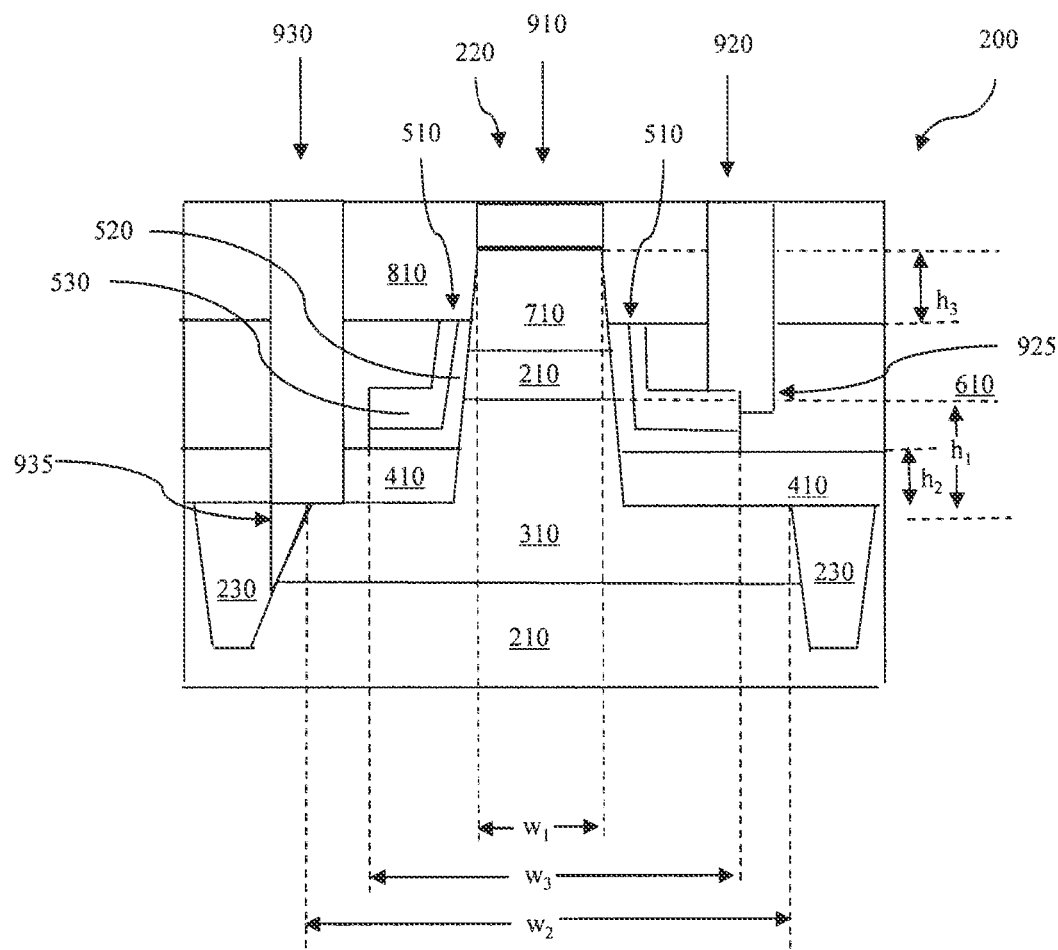

Referring to FIGS. 1 and 11, the method 100 proceeds to step 122 by forming a source contact 910, gate contact 920 and drain contact 930. Contacts 910, 920 and 930 may be formed by lithography patterning and etch processes. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching process includes a dry etch, a wet etch, or a combination of dry etch and wet etch. The dry etching process may implement fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), iodine-containing gas, other suitable gases and/or plasmas, and/or combinations thereof. The etching process may include a multiple-step etching to gain etch selectivity, flexibility and desired etch profile.

In the present embodiment, the contact etch is configured to have an adequate selectivity with respect to source region 710, the gate stack 510 and the drain region 310. In one embodiment, the gate contact 920 is formed at the planar portion of the gate stack 510. Alternatively, the gate contact 920 is formed at the planar portion of the gate stack 510 and overlay at least a portion (925) of the second isolation dielectric layer 610 or a portion of both of first and second isolation dielectric layers 610 and 410. The drain contact 930 is formed at the drain region 310 and overlay at least a portion (935) of the isolation feature 230 by removing the portion 935 of the isolation feature 230 in the contact etch. In the drain contact 930, a portion of the drain region 310 inside the isolation feature 230 is exposed, which enlarges drain contact interface and may result in contact resistance reduction. By forming the gate contact 920 in the planar region of the gate stack 510 and the portion 925 of the isolation dielectric layer, and the drain contact 930 in the drain region 310 and the portion 935 of the isolation feature 230 together, a required active area of the device 200 may be reduced and a constrain of contact lithography process may be relaxed.

The TFET device 200 may undergo further CMOS or MOS technology processing to form various features and regions known in the art. For example, subsequent processing may form various vias/lines and multilayers interconnect features (e.g., metal layers and interlayer dielectrics) on the substrate 210, configured to connect the various features or structures of the TFET device 200. For example, a multi-layer interconnection includes vertical interconnects, such as conventional and horizontal interconnects, such as metal lines. The various interconnection features may implement various conductive materials including copper, tungsten, and/or silicide.

Additional steps can be provided before, during, and after the method 100, and some of the steps described can be replaced, eliminated, or moved around for additional embodiments of the method 100.

Based on the above, the present disclosure offers a TFET device employing a gate contact overlay on the isolation dielectric layer and drain contact overlay on the isolation feature and a method of fabrication. By overlay on the isolation feature, the drain contact resistance is reduced by an enlarged contact interface, a required active area of a device is reduced by saving gate and drain contact area and contact lithography process constrains are relaxed. The method is quite feasible to an existing TFET fabrication.

The present disclosure provides many different embodiments of TFET device that provide one or more improvements over other existing approaches. In one embodiment, the TFET device includes a substrate, a frustoconical protrusion structure disposed over the substrate and protruding out of the plane of substrate, a drain region disposed over the substrate adjacent to the frustoconical protrusion structure and extending to a bottom portion of the frustoconical protrusion structure as a raised drain region. The TFET device also includes an isolation feature between drain regions, a gate stack disposed over the substrate. The gate stack has a planar portion, which is parallel to the surface of substrate and a gating surface, which wraps around a middle portion of the frustoconical protrusion structure, including overlapping with the raised drain region. The TFET device also includes a source region disposed as a top portion of the frustoconical protrusion structure, including overlapping with a top portion of the gating surface of the gate stack, an isolation dielectric layer disposed over the source region, the gate stack and between the planar portion of the gate stack and the drain region. TFET device also includes a gate contact formed on the planar portion of the gate stack and extending to a portion of the isolation dielectric layer and a drain contact formed on the drain region and extending to a portion of the isolation feature.

In another embodiment, a vertical TFET device includes a semiconductor substrate, a frustoconical protrusion cylinder disposed over the substrate and protruding out of the plane of semiconductor substrate, a source region as a top portion of the frustoconical protrusion cylinder, a high-k/ metal gate (HK/MG) disposed over the semiconductor substrate. The HK/MG has a planar portion, which is parallel to the surface of semiconductor substrate and a gating surface, which wraps around a middle portion of the frustoconical protrusion cylinder, including overlapping with the source region. The TFET device also includes a drain region disposed over the semiconductor substrate adjacent to the frustoconical protrusion cylinder and extending to a bottom portion of the frustoconical protrusion cylinder as a raised drain region, an isolation feature disposed between the drain regions, an isolation dielectric layer disposed over the source region, the gate stack and the drain region, including between the planar portion of the HK/MG and the drain region and a drain contact disposed on the drain region and extends to a portion of the isolation feature.

In yet another embodiment, a method of fabricating a semiconductor device includes providing a substrate, etching the substrate to form a protrusion on a surface of the substrate, forming isolation feature on the substrate, doping a portion of the substrate adjacent to the protrusion to form a drain region between isolation features, including extending to a lower portion of the protrusion to form a raised drain region. The method also includes forming a first isolation dielectric layer over the drain region, forming gate stack having a planar portion over the drain region, which is parallel to the surface of substrate, and a gating surface, which wraps around a middle portion of the protrusion, including overlapping with the raised drain region. The method yet also includes forming a second isolation dielectric layer over the planar portion of the gate stack and the drain region, recessing a portion of the gating surface of the gate stack to expose a top portion of the protrusion, forming a source region on the top portion of the protrusion with a different dope type than the drain region, including overlapping with the gating surface of the gate stack. The method yet also includes forming a third isolation dielectric layer over the source region, the gate stack and the second isolation dielectric layer, forming a drain contact on the drain region and a portion of the isolation feature together and simultaneously with the drain contact formation, forming a gate contact on the planar portion of the gate stack and extending to a portion of the isolation dielectric layer, and a source contact on the source region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. For example, source and drain regions are often swapped with an appropriate process modification/ interchanging, depending on the transistor's eventual use and electrical configuration. Therefore, the terms "source" and "drain" are deemed to be interchangeable under such circumstances. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a semiconductor structure extending from a substrate, the semiconductor structure including:
   a first region including a first dopant, the first region having a first portion disposed at a first level and a second portion disposed at a second level that is different than the first level;
   a second region disposed over the first region, the second region including a second dopant that is different than the first dopant;
   a gate dielectric layer interfacing with the second region without interfacing with the first portion of the first region, wherein the gate dielectric layer extends continuously from the second region to the second portion of the first region such that gate dielectric layer interfaces with the second portion of the first region;
   a first contact interfacing with at least the first portion of the first region; and
   an interlayer dielectric layer disposed over the substrate, the interlayer dielectric layer interfacing with the second region and the first contact.

2. The device of claim 1, wherein the first portion of the first region has a first width and the second portion of the first region has a second width that is less than the first portion.

3. The device of claim 2, wherein the second region has a third width that is less than the second width.

4. The device of claim 1, further comprising a dielectric isolation structure disposed on the substrate, and
   wherein the first portion of the first region interfaces with the dielectric isolation structure.

5. The device of claim 1, further comprising a gate electrode disposed on the gate dielectric layer, the gate dielectric layer and the gate electrode interfacing with the interlayer dielectric layer.

6. The device of claim 1, further comprising:
   a gate electrode disposed on the gate dielectric layer;
   a second contact interfacing with a top surface and a side surface of the gate electrode.

7. The device of claim 1, further comprising a second contact interfacing with the second region of the semiconductor structure.

8. The device of claim 1, wherein the second region of the semiconductor structure is spaced apart from the first region of the semiconductor structure.

9. A device comprising:
   a substrate having a raised structure extending therefrom, the raised structure including a doped region having a bottom portion and a top portion, the bottom portion being wider than the top portions, the doped region including a first dopant;
   an epitaxial feature disposed directly on the raised structure, the epitaxial feature including a second dopant that is different than the first dopant;
   a gate stack including a gate dielectric layer interfacing with the epitaxial feature and the doped region;
   a first contact interfacing with the doped region; and
   an interlayer dielectric layer disposed over the substrate and interfacing with the epitaxial feature and the first contact.

10. The device of claim 9, wherein the substrate is formed of a different material than the epitaxial feature.

11. The device of claim 9, further comprising a dielectric isolation structure disposed on the substrate, and
    wherein the first contact interfaces with the dielectric isolation structure.

12. The device of claim 9, further comprising a second contact interfacing with the epitaxial feature.

13. The device of claim 9, wherein the raised structure is formed of a semiconductor material.

14. The device of claim 9, wherein the first dopant is a fist-type of dopant, and
wherein the second dopant is a second-type of dopant, the second-type being opposite the first-type.

15. The device of claim 9, wherein a top surface of the epitaxial feature is free of the gate stack, the top surface of the epitaxial feature facing away from the raised structure.

16. The device of claim 9, wherein the raised structure has a shape selected from the group consisting of a cylinder shape, a square-column shape, an oval cylinder shape, a rectangular column shape, and a hexagonal column shape.

17. A device comprising:
a protrusion structure disposed above a substrate, the protrusion structure having:
a first source/drain feature including a first dopant; and
a second source/drain feature including a second dopant that is different than the first dopant;
a gate stack disposed along and interfacing with the first and second source/drain features, the gate stack including a gate dielectric layer and a gate electrode layer, wherein the gate dielectric layer interfaces with the first and second source/drain features;
a first interlayer dielectric layer disposed directly on the first source/drain feature;
a second interlayer dielectric layer disposed directly on the first interlayer dielectric layer, the second interlayer dielectric layer interfacing with the gate stack;
a third interlayer dielectric layer disposed directly on the second interlayer dielectric layer, the third interlayer dielectric layer interfacing with the second source/drain feature;
a first contact extending through the first, second and third interlayer dielectric layers to electrically connect to the first source/drain feature; and
a second contact extending through the second and third interlayer dielectric layers to interface with a sidewall of the gate electrode layer, the sidewall of the gate electrode facing away from the first source/drain feature and the second source/drain feature.

18. The device of claim 17, wherein the first contact is disposed on a first side of the protrusion structure and the second contact is disposed on a second side of the protrusion structure, the second side opposite the first side.

19. The device of claim 17, wherein the second contact is spaced apart from the first interlayer dielectric layer.

20. The device of claim 17, further comprising a dielectric isolation structure disposed on the substrate, and
wherein the first contact physically contacts the dielectric isolation structure.

* * * * *